United States Patent [19]

Hasegawa

[11] Patent Number: 5,363,381
[45] Date of Patent: Nov. 8, 1994

[54] INTEGRATED CIRCUIT DEVICE HAVING MACRO ISOLATION TEST FUNCTION

[75] Inventor: Yasuyuki Hasegawa, Tokyo, Japan
[73] Assignee: NEC Corporation, Japan
[21] Appl. No.: 787,044
[22] Filed: Nov. 4, 1991

[30] Foreign Application Priority Data

Nov. 5, 1990 [JP] Japan ................... 2-300370

[51] Int. Cl.$^5$ ........................... H04B 17/00
[52] U.S. Cl. ................... 371/22.1; 324/73.1; 324/158.1
[58] Field of Search ........... 371/22.1, 27, 15.1, 371/22.6; 324/73.1, 158 R

[56] References Cited

U.S. PATENT DOCUMENTS

| | | | |
|---|---|---|---|
| 4,837,765 | 6/1989 | Suzuki | 371/22.1 |
| 5,027,183 | 6/1991 | Dreps | 357/48 |
| 5,101,153 | 3/1992 | Morong, III | 371/27 |
| 5,103,167 | 4/1992 | Okano et al. | 371/22.1 |
| 5,153,509 | 10/1992 | Dalrymple et al. | 371/22.1 |
| 5,161,159 | 11/1992 | McClure et al. | 371/22.1 |

FOREIGN PATENT DOCUMENTS 0330841  6/1989  European Pat. Off. .

OTHER PUBLICATIONS

"Direct Access Test Scheme-Design of Block and Core Cells for Embedded Asics" V. Immaneni et al, Sep. 1990 IEEE pp. 488-492.

Primary Examiner—Robert W. Beausoliel, Jr.
Assistant Examiner—Phung M. Chung
Attorney, Agent, or Firm—Laff, Whitesel, Conte & Saret

[57] ABSTRACT

An integrated circuit device comprises a mega-macro(s) and an interface block section. At least one of the mega-macro and the interface block section comprises a switching circuit for switching a mode between a test mode and a normal mode and two sets of individual dedicated terminals which are valid in the normal mode and the test mode, respectively, and serve to transfer signals to/from an internal circuit. In such an arrangement, an mega-macro isolation test can be simplified and also a designer can design the circuit in a normal mode with no consciousness of the presence of a test circuit thereby making it easy to analyze and debug the circuit, so that the burden of test designing for a designer can be removed thereby to shorten the time needed for developing the integrated circuit device.

6 Claims, 10 Drawing Sheets

INTEGRATED CIRCUIT DEVICE HAVING MACRO ISOLATION TEST FUNCTION

BACKGROUND OF THE INVENTION (1) Field of the Invention

The present invention relates to an integrated circuit device composed of a plurality of function macro cells and, more particularly, to an integrated circuit device comprising one or more macro cells (hereinafter referred to as "mega-macro") designed in advance as a library of a large scale standard function block, zero or more macro cell(s) (hereinafter referred to as "user-macro") structured by a combination of a plurality of standard basic cells, and an interface block composed of a plurality of cells designed as a library of a standard function block for transferring signals between external terminals and an internal region.

(2) Description of the Related Art

In the integrated circuit device in a standard cell system structured by wiring a mega-macro(s) and a user-macro(s), the following test is carried out in many cases. A certain mode is set to allot the terminals of macro cells (hereinafter simply called "macro") to external terminals of the integrated circuit device, respectively. A signal is applied to each of the macro terminals through each of the external terminals to directly observe the output from the external terminal. Thus, each of the macros can be individually tested. Hereinafter, such a testing method will be referred to as a "macro isolation test".

Now referring to the drawings, an explanation will be given on one example of the conventional integrated circuits capable of performing such macro isolation test.

FIG. 1 shows an arrangement of the conventional single chip integrated circuit device 1. As shown in FIG. 1, the integrated circuit 1 is composed of mega-macros 2, 3; a user-macro 6 and an input/output interface macro 7. The input/output interface macro 7 serves as an interface between external terminals (hereinafter referred to as "pins") of a chip of the integrated circuit device and gates within the chip. The input/output interface macro 7 is composed of input interface blocks 8, 9; an output interface block 10; and an input-/output interface block 11, and these blocks serve to transfer signal between pins A, B, C and D and the gates concerned within the integrated circuit device 1.

The mega-macro 2 is provided with a single input terminal in1, a single input/output terminal io1, and two output terminals out1 and out2. For the purpose of clearly showing the attributes of these terminals, the mega-macro 2 is illustrated in such a form that a macro core 4 which is a body of the mega-macro is separated from the other buffer portions. Specifically, the input terminal in1 of the mega-macro 2 is connected with the terminal C1 of the macro core 4 through an input buffer 201; the input/output terminal io1 is connected with the terminals C3 and C4 of the macro core 4 through an input/output buffer 202; the first output terminal out1 is connected with the terminal C2 of the macro core 4 through an output buffer 203; and the second output terminal out2 is connected with the terminal C5 through an output buffer 204. It should be noted that the output at the output terminal out2 of the mega-macro 2 represents the input/output state at the input-/output terminal io1; the signal level "High", i.e., "1" at the output terminal out2 represents an "input state" at the terminal io1 while the signal level "Low", i.e., "0" at the terminal out2 represents an "output state" of the output terminal out1. Hereinafter, the signal level "High" is referred to as simply "1" and the signal level "Low" is referred to as simply "0".

Likewise, the mega-macro 3 is also separated into the macro core 5 which is a body of the macro and other buffer portions. Specifically, the input terminal in1 of the mega-macro 3 is connected with the terminal C6 of the macro core 5 through an input buffer 301; the first output terminal out1 is connected with the terminal C7 through an output buffer 302; the second output terminal out2 is connected with the terminal C8 of the macro core 5 through a three-state output buffer 303; and the third output terminal out3 is connected with the terminal C9 through an output buffer 304. It should be noted that the output state at the output terminal out3 of the mega-macro indicates whether or not the second output terminal out2 is in its "high impedance state"; "1" at the output terminal out3 represents the high impedance state at the second output terminal out2 whereas "0" at the terminal out3 represents the level output state of "0" or "1" at the second output terminal out2.

FIG. 2 shows a conventional arrangement in which a test circuit 21 is added to the circuit 1 so that the macro isolation test can be made for the mega-macros 2, 3. In FIG. 2, an integrated circuit device 25 is the integrated circuit device 1 equipped with a macro isolation circuit.

In FIG. 2, a decoder 13 produces three separate signals M1TEST, M2TEST and NORMAL on the basis of signals inputted through input interface blocks 12$_1$ and 12$_2$ from pins T1 and T2 of the integrated circuit device 25. The signal M1TEST is "1" when the mega-macro 2 is to be isolatedly tested, the M2TEST is "1" when the mega-macro 3 is to be isolatedly tested, and the NORMAL is "1" at the normal state when the integrated circuit device 25 is placed in the state equivalent to the integrated circuit device 1. Thus, the inputs at the pins T1 and T2 define the isolation test states. Selectors 16, 17 and 18$_1$ to 18$_3$ in the test circuit 21 operate as follows. The selector 16 produces, at its output terminal O, the signal at its input terminal N in response to the signal M2TEST="0" and the signal at its input terminal M2 in response to the signal M2TEST="1", respectively. The selector 17 produces, at its output terminal O, the signal at its input terminal N in response to the signal M1TEST="0" and the signal at its input terminal M1 in response to the signal M1TEST="1", respectively. The selectors 18$_1$, 18$_2$ and 18$_3$ produce, at their output terminals O, the signal at their input terminals N in response to the signal NORMAL="1", the signal at the input terminal M1 in response to the signal M1TEST="1" and the signal at their input terminals M2 in response to the signal M2TEST="1", respectively.

The operation of the test circuit 21 in the integrated circuit device 25 will be explained.

In the state where the signal NORMAL="1", all the selectors 16, 17, 18$_1$, 18$_2$ and 18$_3$ produce, at their output terminals O, the signal at their input signals N. Then, the signal M1TEST="0" and so the output from the three-state buffer 14 is at its high impedance state, so that the integrated circuit device 25 is substantially equivalent to the integrated circuit device 1.

In the state where the signal M1TEST="1", the selectors 17, 18$_1$, 18$_2$ and 18$_3$ connect the input terminal in1 of the mega-macro 2 with the pin A, the first output terminal out1 with the pin C, and the input/output terminal io1 with the pin D through the input/output interface block 11 in a state where the input and output sides are separated from each other. Further, the second output terminal out2 of the mega-macro 2 is connected with the input/output control terminal 20 of the input/output interface block 11. And, the terminal out2 essentially represents the input/output state of the input/output terminal io1 so that the state of the pin D permits the states of both the terminals io1 and io2 to be recognized. Thus, the macro isolation test for the macro 2 can be made through the pins A, C and D.

In the state where the signal M2TEST="1", the selectors 16, 18$_1$, 18$_2$ and 18$_3$ connect the terminals in1, out1 and out2 with the pins A, C and D, respectively. Further, the terminal out3 of the mega-macro 3 is connected with the input/output control terminal 20 of the input/output interface block 11 so that the states of the terminal out3 can be observed through the state of the pin D. Thus, the macro isolation test can be made through the pins A, C and D.

However, the conventional integrated circuit device including the macro isolation testing circuit has the following disadvantage.

As seen from FIG. 2, the selectors 16, 17, 18$_1$-18$_3$ for macro isolation test are inserted between the macros shown in FIG. 1. This results In an inconvenience of signal propagation delay in the normal mode. Particularly, if there are a larger number of mega-macros to be subjected to the isolation test, the selectors included in the test circuit become large-scale and, thus, the influence of delay appearing in the normal mode is very serious. For this reason, designing based on careful consideration must be made for portions where there is a critical path and there is a need for a precise timing to be controlled owing to racing in order to prevent an adverse effect on these portions. This makes it very complicate to design the conventional macro isolation test. The conventional design for the macro isolation test is likely to produce some errors for a simple logic level (level in the logic design) as well as for the characteristic such as the critical path.

Further, the circuit diagram including a test circuit, which is accompanied by many additional circuits as shown in FIG. 2, is much more complicate and difficult to read than the circuit in the normal state as shown in FIG. 1, whereby it is difficult to analyze and debug the circuit.

As described above, the integrated circuit device adopting the conventional macro isolation testing technique gives a designer a heavy burden in the step of test designing so that the time required for developing the desired integrated circuit device is extended.

SUMMARY OF THE INVENTION

The present invention has been accomplished in order to solve the above disadvantages existing in the conventional devices.

An object of the present invention is to provide an improved integrated circuit device which can simplify the designing of a mega-macro isolation test and also permits a designer to design the circuit device in a normal mode with no consciousness for the presence of a test circuit, thereby making it easy to analyze and debug the circuit, so that the burden of test designing for a designer can be removed thereby to shorten the time required for developing the integrated circuit device.

In order to attain the above object, in accordance with the present invention, there is provided an integrated circuit device in which at least one of a mega-macro(s) and an interface block section having means for switching a mode between a test mode and a normal mode and two sets of individual dedicated terminals which are valid in the test mode and the normal mode, respectively and serves to transfer signals to/from an internal region.

More specifically, in the integrated circuit according to the present invention, at least one of the mega-macro and the interface block is provided with two sets of individual terminals of a test mode terminal valid in a test mode and a normal mode terminal valid in a normal mode so that designing for the normal mode can be implemented by normal mode wiring of wiring the normal mode terminals of the mega-macro and the interface block, and designing for mega-macro isolation test can be implemented by test mode wiring of individually wiring the respective test mode terminals of the mega-macro and the interface block.

Thus, designing for the mega-macro isolation test is work of forming simple decoders and wiring the terminals. This work is very easy so that it can be easily automated without experiencing human error.

The normal mode wiring and the test mode wiring can be individually made so that with respect to the characteristic, a designer can design the circuit in a normal mode with no consciousness of the presence of the test circuit.

If the circuit diagram is shown with the test mode wiring portion omitted, it can be illustrated as a very clear circuit with the test circuit being concealed. Therefore, the circuit diagram can be easily analyzed and debugged.

Consequently, the burden given for a designer for test designing is reduced so that the time required for developing an integrated circuit device can be shortened.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, referring to the accompanying drawings, an explanation will be given on some embodiments of the present invention.

Figure 3A:
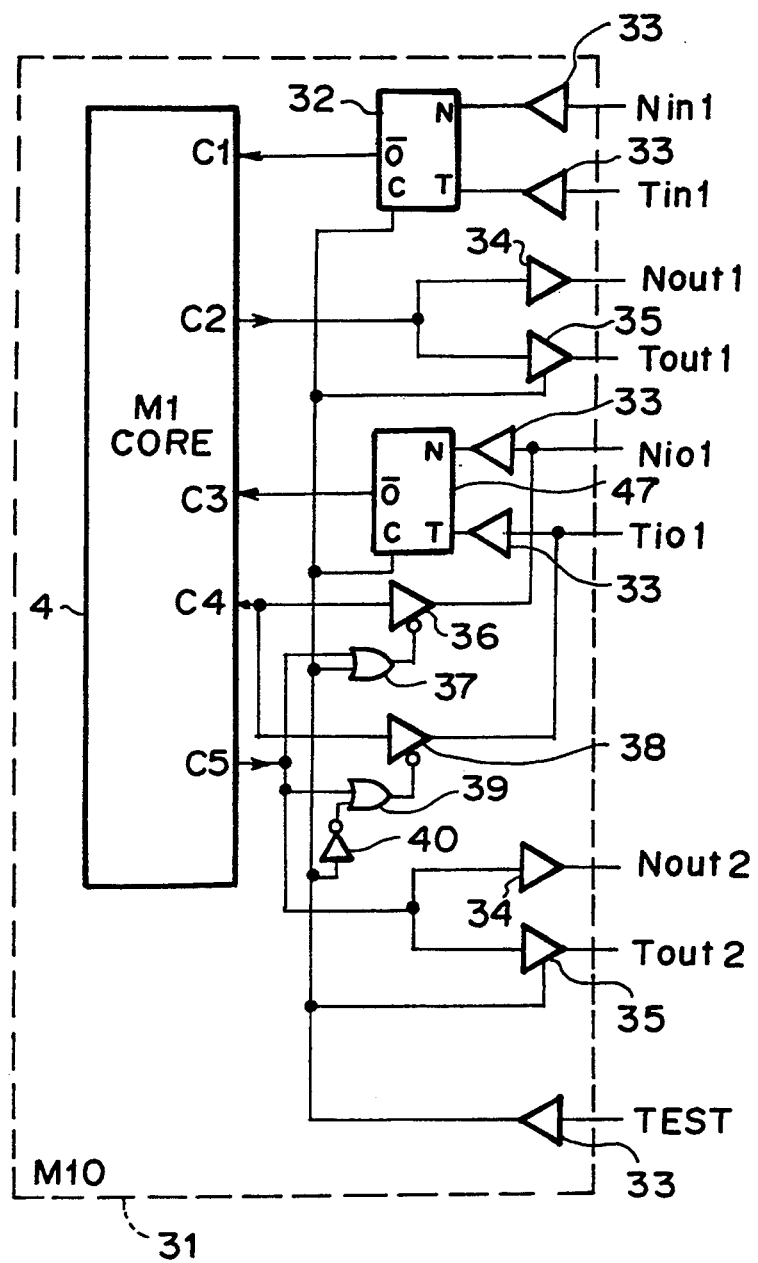
FIGS. 3A and 3B are block diagrams of the megamacros according to the first embodiment of the present invention.
Figure 3B:
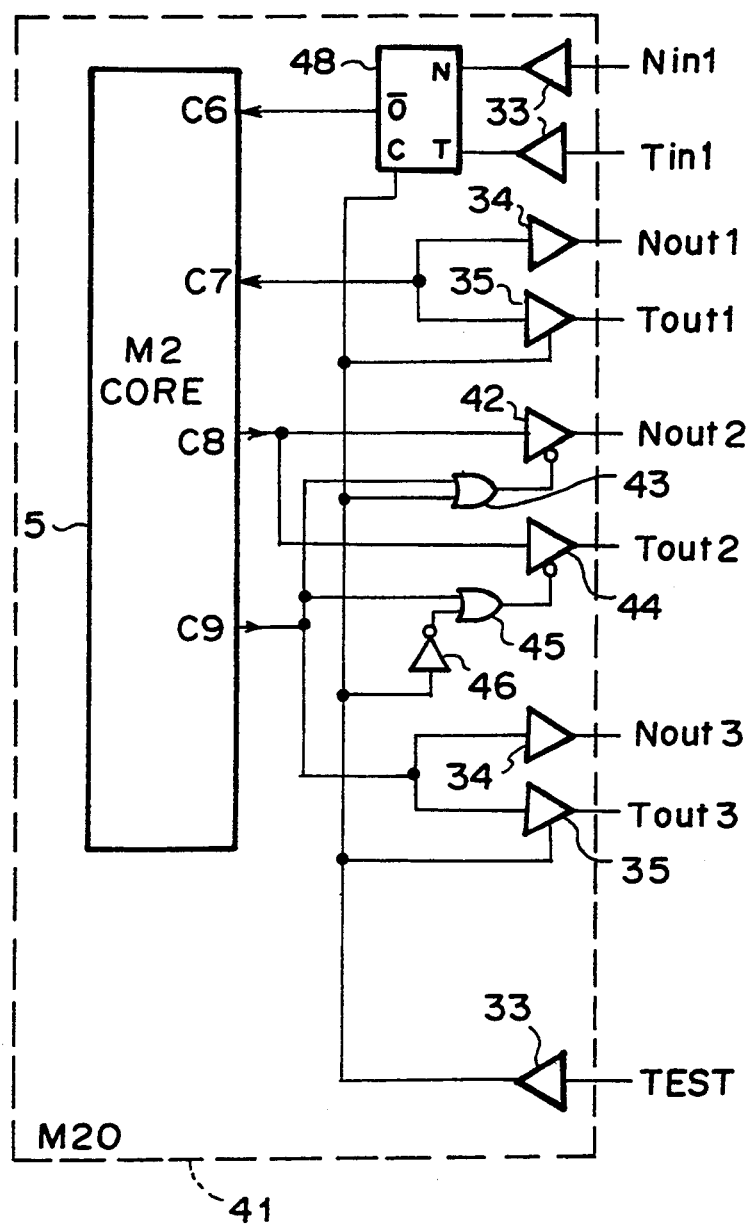
Figure 4A:
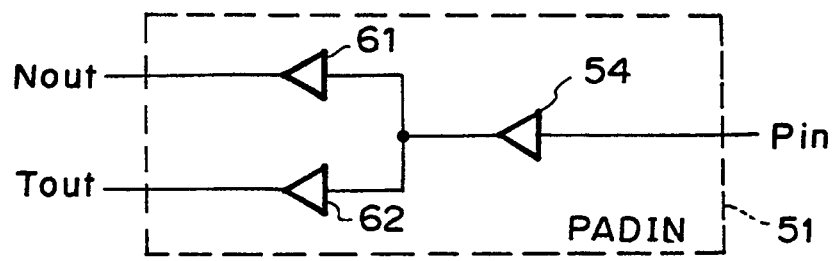
FIGS. 4A to 4C are block diagrams of the interface blocks according to the first embodiment of the present invention.
Figure 4B:
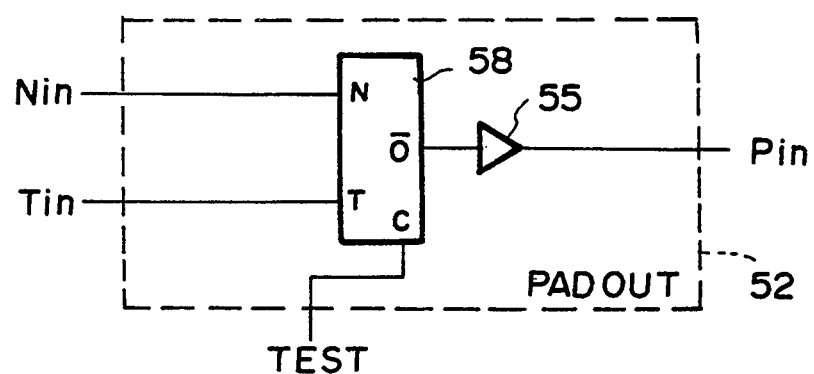
Figure 4C:
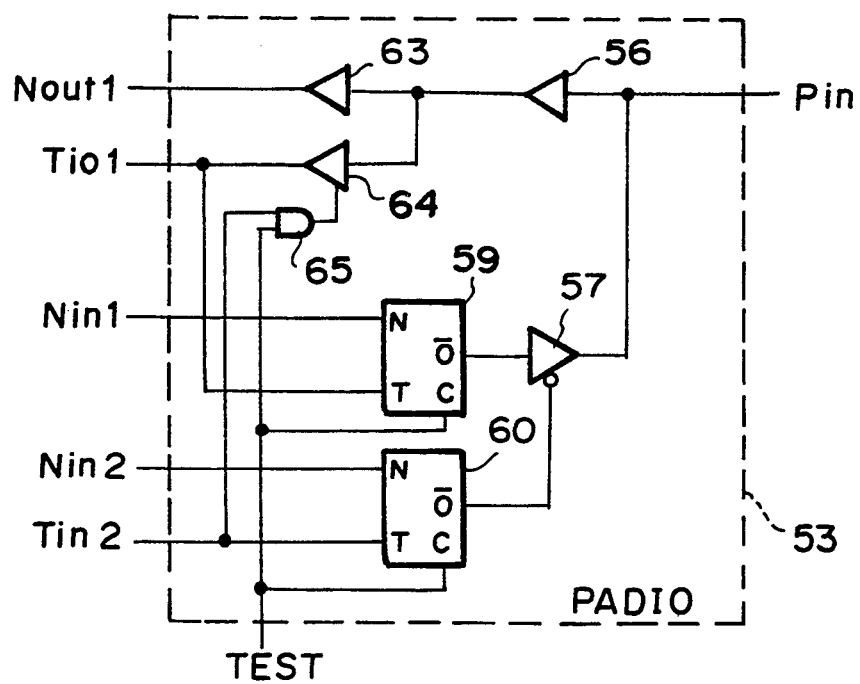

FIGS. 3A and 3B show the structure of each of mega-macros 31 and 41 according to one embodiment of the present invention, respectively. FIGS. 4A, 4B and 4C show the structure of each of interface blocks 51, 52 and 53, respectively.

Figure 1:
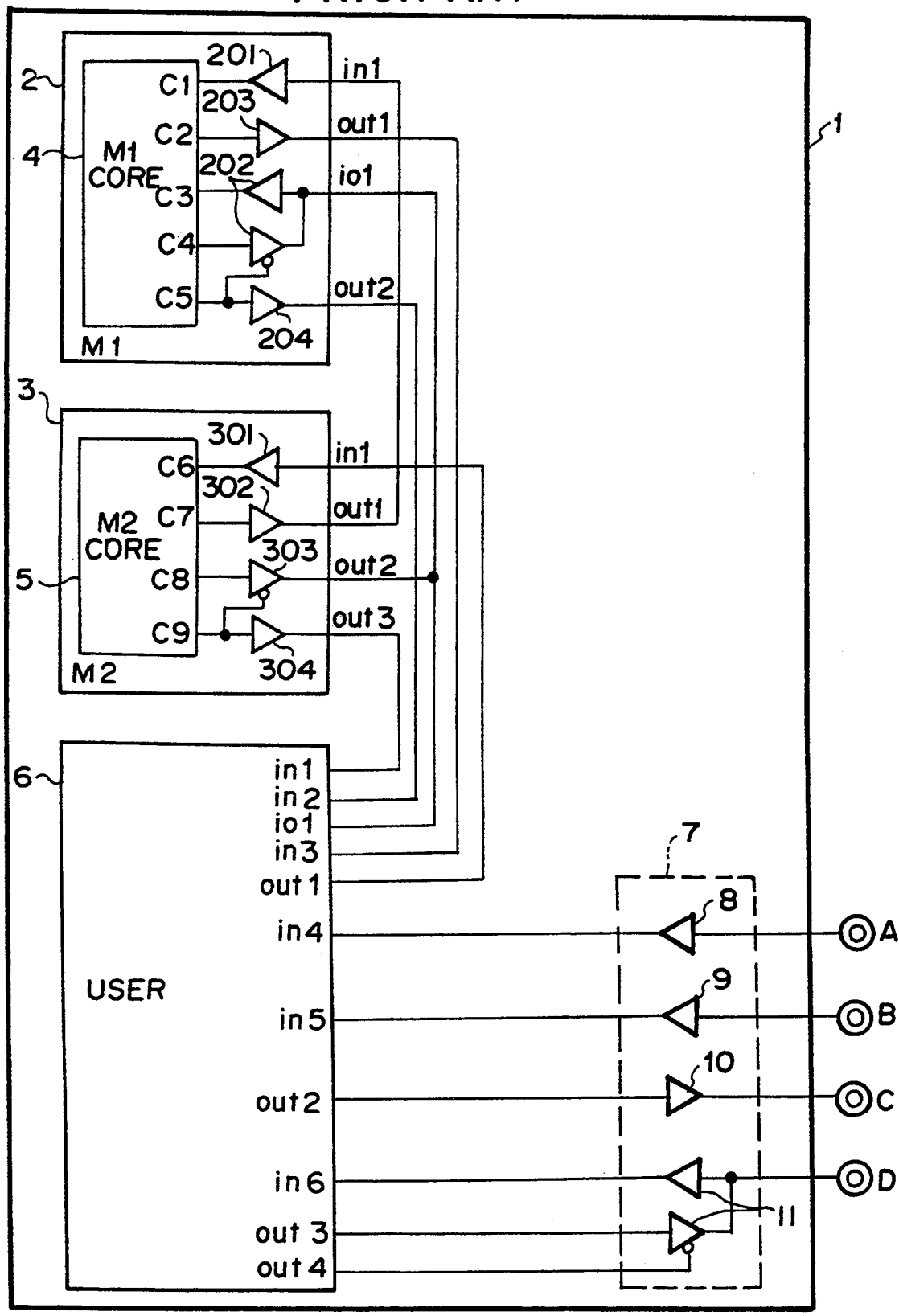
FIG. 1 is a block diagram of one example of the conventional integrated circuit devices.
Figure 2:
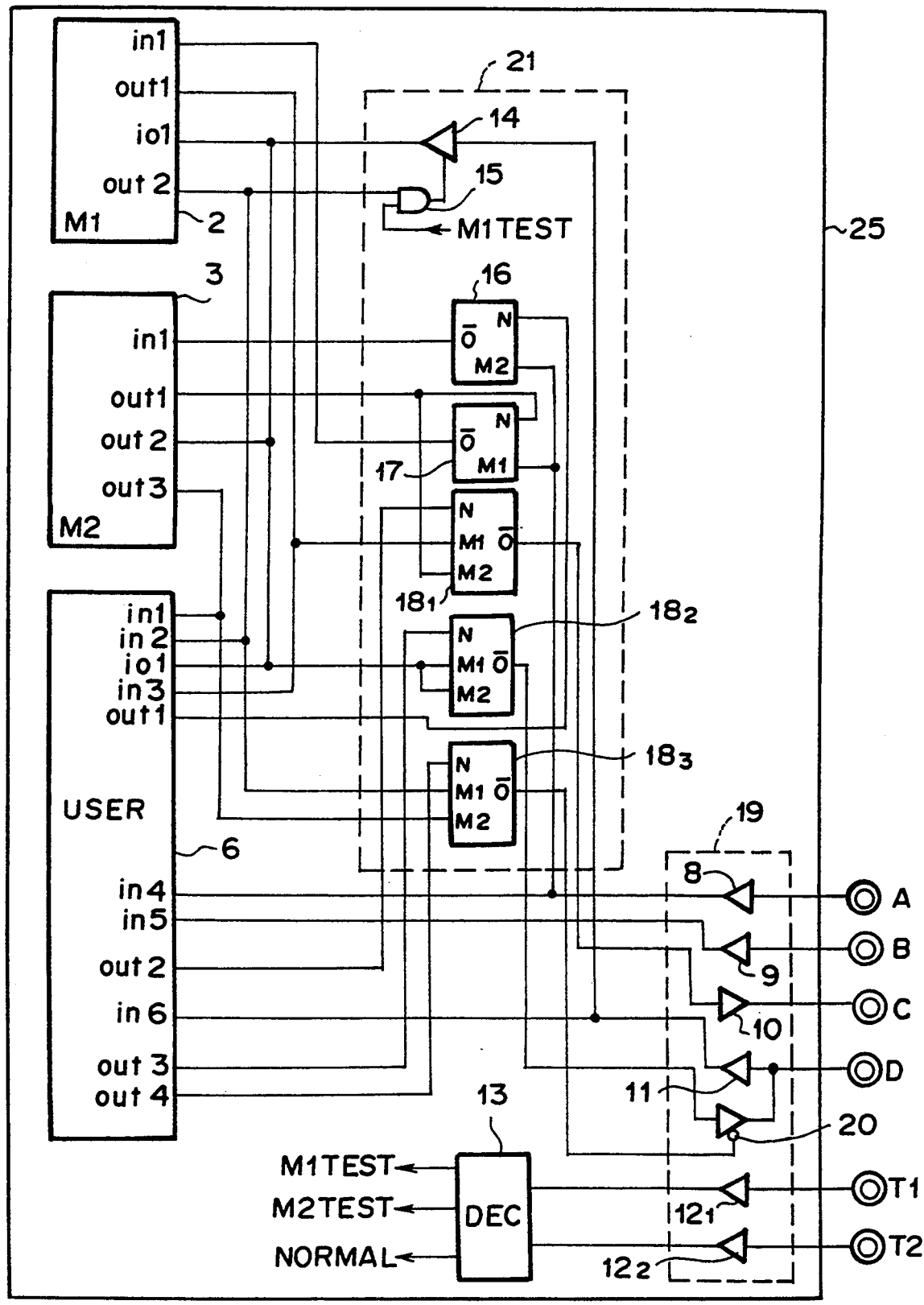
FIG. 2 is a block diagram of the conventional integrated circuit including a mega-macro test circuit.

In FIGS. 3A and 3B, the mega-macros 31 and 41 are mega-macros where the present invention is applied to the mega-macros 2 and 3 shown in FIG. 1.

The mega-macro 31 corresponds to the mega-macro 2 in FIG. 1 and the mega-macro 41 corresponds to the mega-macro 3 in FIG. 1. Selectors 32, 47 and 48, when the input at their terminals C is "0", output to their output terminals O the input signal value at their terminals N, whereas when the input at their terminals C is "1", output to their output terminals O the input signal value at their terminals T. The mega-macro 31, like the mega-macro 2 in FIG. 1, incorporates therein a macro core 4. The operation of the mega-macro 31 will be explained individually as to the cases where the level of the terminal TEST of the mega-macro 31 is "0" and "1".

(i) TEST="0":

The selector 32 outputs the input signal at the terminal N to the terminal O, so that the input signal at a terminal $N_{in1}$ is inputted to the terminal C1 of the macro core 4 as it is. Then, the input at a terminal $T_{in1}$ is ignored. Although the output at the terminal C2 of the macro core 4 is outputted to a terminal $N_{out1}$ as it is, it is not outputted to a terminal $T_{out1}$ by the function of a three-state buffer 35 at the final stage, whereby the terminal $T_{out1}$ is placed in a high impedance state. A terminal $N_{io1}$, when the output at a terminal C5 is "0", serves as an output terminal to output the output signal value at a terminal C4, and when the output at the terminal C5 is "1", the terminal $N_{io1}$ serves as an input terminal to input a signal to a terminal C3. A terminal $T_{io1}$ is always placed in an input state. The output at the terminal C5 is outputted to a terminal $N_{out2}$ as it is whereas a terminal $T_{out2}$ is placed in the high impedance state by the function of the three-state buffer 35.

(ii) TEST="1":

The selector 32 outputs the input signal at the terminal T to the terminal O, so that the input signal at the terminal $T_{in1}$ is inputted to the terminal C1 of the macro core 4 as it is. Then, the input at the terminal $N_{in1}$ is ignored. The output at the terminal C2 of the macro core 4 is outputted to both the terminals $T_{out1}$ and $N_{out1}$ as it is. The terminal $T_{io1}$, when the output at the terminal C5 is "0", serves as an output terminal to output the signal value at the terminal C4, and when the output at the terminal C5 is "1", the terminal $T_{io1}$ inputs a signal to the terminal C3. On the other hand, the terminal $N_{io1}$ is always placed in an input state. The output at the terminal C5 is commonly outputted to both the terminals $T_{out2}$ and $N_{out2}$.

As described above, when the input at the terminal TEST is "0", the mega-macro 31 serves as the mega-macro having the same function as the mega-macro 2 (FIG. 1) by means of the terminals $N_{in1}$, $N_{out2}$, $N_{io1}$ and $N_{out2}$ (hereinafter, these four terminals are referred to as "normal mode terminals" of the mega-macro 31). On the other hand, when the input at the terminal TEST is "1", the mega-macro 31 serves as the mega-macro having the same function as the mega-macro 2 by means of the terminals $T_{in1}$, $T_{out1}$, $T_{io1}$ and $T_{out2}$ (hereinafter, these four terminals are referred to as "test mode terminals" of the mega-macro 31).

Next, the operation of the mega-macro 41 corresponding to the mega-macro 3 in FIG. 1 will be explained below.

In accordance with the input at the TEST terminal, the mega-macro 41 also controls the signal values at the other terminals. Specifically, when the input at the terminal TEST is "0", the mega-macro 41 serves as the mega-macro having the same function as the mega-macro 3 (FIG. 1) by means of the terminals $N_{in1}$, $N_{out1}$, $N_{out2}$ and $N_{out3}$ (hereinafter, these four terminals are referred to as "normal mode terminals" of the mega-macro 41). On the other hand, when the input at the terminal TEST is "1", the mega-macro 41 serves as the mega-macro having the same function as the mega-macro 3 by means of the terminals $T_{in1}$, $T_{out1}$, $T_{out2}$ and $T_{out3}$ (hereinafter, these four terminals are referred to as "test mode terminals" of the mega-macro 41).

The interface block section to which the first embodiment of the present invention is applied is composed of an input interface block unit 51 (FIG. 4A), an output interface block unit 52 (FIG. 4B), and an input/output block unit 53 (FIG. 4C). Selector 58 (in the block unit 52) and selectors 59, 60 (in the block unit 53), when the input at their terminals C is "0", output to the terminals O the input at the terminals N, and when the input at the terminals C is "1", they output to the terminals O the input at the terminals T. The input interface block unit 51 incorporates an input interface block 54, the output interface block unit 52 incorporates an output interface block 55, and the input/output interface block 53 incorporates an input interface block unit 56 and a three-state output interface block 57. In accordance with the output signal at the terminal O of the selector 60 which is a low active control signal, the three-state interface block 57 receives an output at the terminal O of the selector 59 as a data input. The input interface block unit 51 takes in at its terminal $P_{in}$ the input signal inputted from a pin, and outputs the corresponding signal at the terminals $N_{out}$ and $T_{out}$ through the interface block 54 (hereinafter, these terminals $N_{out}$ and $T_{out}$ are referred to as the "normal mode terminal" and the "test mode terminal" of the input interface block unit 51, respectively).

The output interface block unit 52 outputs to the terminal $P_{in}$, through the output interface block 55, the signal at the terminal $N_{in}$ when the signal at the terminal TEST is "0", or the signal at the terminal $T_{in}$ when the signal at the terminal TEST is "1", respectively (hereinafter, these terminals $N_{in}$ and $T_{in}$ are referred to as the "normal mode terminal" and the "test mode terminal" of the output interface block unit 52).

The input/output interface block unit 53, when the signal at the terminal TEST is "0", gives the input signal at the terminal $P_{in}$ to the terminal $N_{out1}$ and receives from the terminal $N_{in1}$ the data to be outputted to the terminal $P_{in}$ and from the terminal $N_{in2}$ the control signal for input/output switching (hereinafter, the terminals $N_{out1}$, $N_{in1}$ and $N_{in2}$ are referred to as the "normal mode terminals" of the input/output interface block unit 53). On the other hand, when the signal at the terminal TEST is "1", the input/output interface block unit 53 receives at its terminal $T_{in2}$ the input/output switching control signal and at the terminal $T_{io1}$ the input/output data to be outputted to the terminal $P_{in}$ (hereinafter, these terminals $T_{io1}$ and $T_{in2}$ are referred to as the "test mode terminals" of the input/output interface block unit 53).

Thus, with reference to FIGS. 3A, 3B and FIGS. 4A to 4C, the mega-macros and the interface block units to which the first embodiment of the present invention has been applied have been explained. Now referring to FIG. 5, an explanation will be given on a specific example in which these components are applied to or incorporated in an actual integrated circuit device to implement the macro isolation test.

Figure 5:
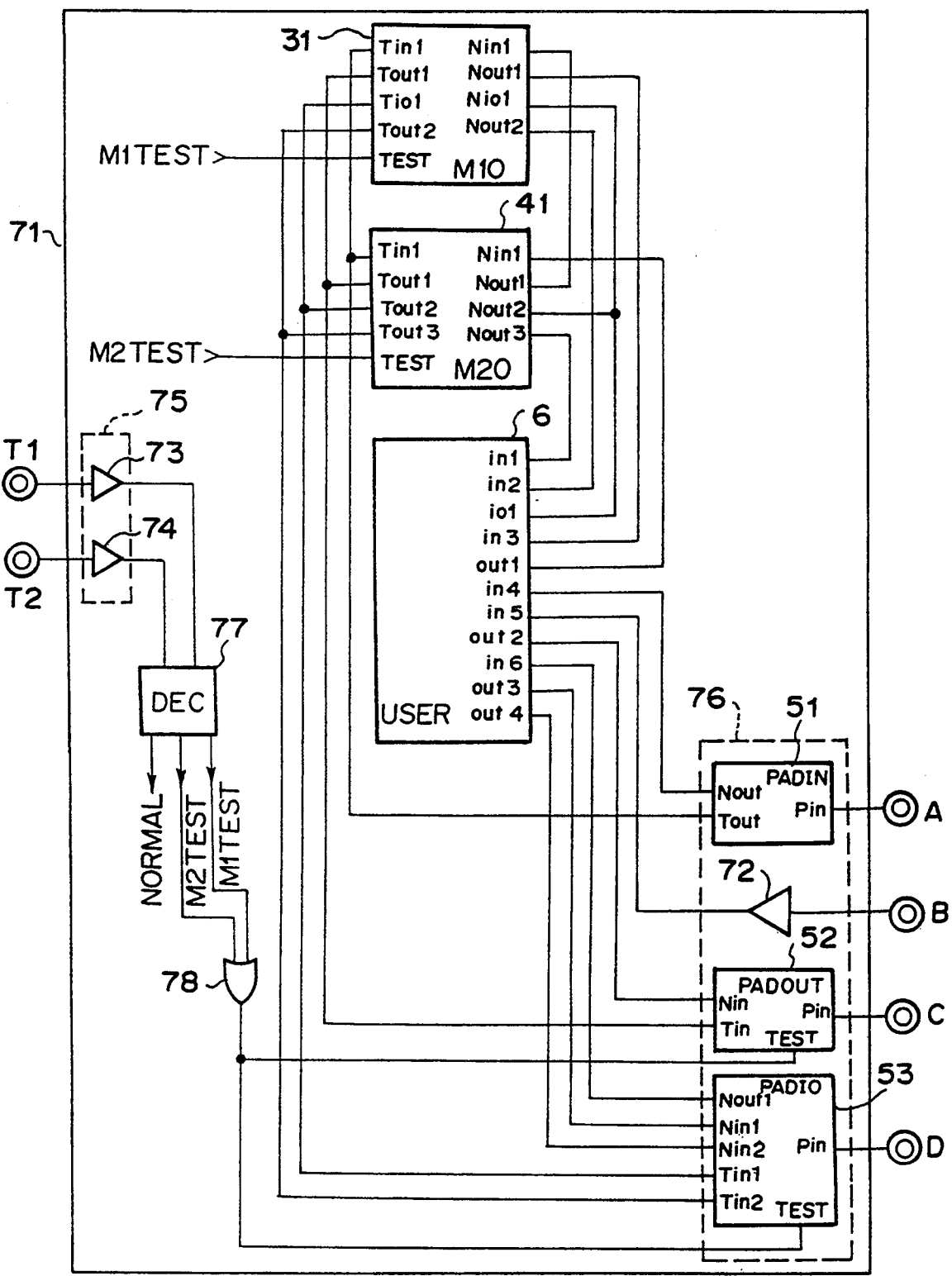
FIG. 5 is a block diagram of the integrated circuit device including a test circuit which adopts the megamacros and the interface blocks shown in FIGS. 3A, 3B and FIGS. 4A–4C, respectively.

FIG. 5 shows an arrangement of the integrated circuit device 71 which comprises mega-macros 31, 41 shown in FIGS. 3A, 3B and the input, the output and the input/output interface block unit 51, 52 and 53 shown in FIGS. 4A to 4C. In addition to the mega-macros 31, 41, and the input, the output and the input/output interface block unit 51, 52 and 53, the integrated circuit device 71 includes input interface blocks 72, 73 and 74 and a decoder 77. The part constituted by these components, on the basis of the signals inputted from the pins T1 and T2, produces a signal M1TEST that is "1" when the mega-macro 31 is subjected to the isolation test, a signal M2TEST that is "1" when the mega-macro 41 is subjected to the isolation test, and a signal NORMAL that is "1" in a normal state. The signal M1TEST is supplied to the terminal TEST of the mega-macro 31; the signal M2TEST is supplied to the TEST terminal of the mega-macro 41; and the signal that is the logical OR of the signals M1TEST and M2TEST taken by an OR gate 78 is supplied to the respective TEST terminals of the output interface block unit 52 and the input/output interface block unit 53.

In FIG. 5, the wirings between the user macro 6, and the respective normal mode terminals of the mega-macros 31, 41 and the interface block units 51, 52 and 53 are made in the same manner as the wirings among the individual macros within the integrated circuit device of FIG. 1. More specifically, the wirings are made in correspondence between the terminals $N_{in1}$, $N_{out1}$, $N_{io1}$ and $N_{out2}$ of the mega-macro 31 and the terminals in1, out1, io1 and out2 of the mega-macro 2; between the terminals $N_{in1}$, $N_{out1}$, $N_{out2}$ and $N_{out3}$ of the mega-macro 41 and the terminals in1, out1, out2 and out3 of the mega-macro 3; between the terminal $N_{out}$ of the input mega-macro 3; between the terminal $N_{out}$ of the input interface block unit 51 and the output terminal of the interface block 8; between the output terminal of the input interface block 72 and the output terminal of the interface block 9; between the terminal $N_{in}$ of the output interface block unit 52 and the input terminal of the interface block 10; and between the terminals $N_{out1}$, $N_{in1}$, and $N_{in2}$ of the input/output interface block unit 53 and the data output terminal, the data input terminal and the input/output control terminal of the interface block 11. (Hereinafter, such wirings are referred to as "normal mode wirings").

Further, the test mode terminals of the mega-macros 31 and 41 are directly wired or connected with the test mode terminals of the interface block units 51, 52 and 53. (Such wirings between the test mode terminals are referred to as "test mode wirings").

An explanation will be given on the operation of the integrated circuit device 71 with respect to its test mode and its normal mode.

First, in the normal mode where both the output signals M1TEST and M2TEST from the decoder 77 are "0", the level "0" is applied to the respective TEST terminals of the mega-macros 31 and 41, and of the interface block units 52 and 53. Thus, in the mega-macros 31, 41 and the interface blocks 52, 53, their normal mode terminals are valid.

As described above, the wirings among the normal mode terminals are equivalent to those among the macros in the integrated circuit device 1 shown in FIG. 1, so that the integrated circuit device 71 is logically equivalent to the integrated circuit device 1.

Next, the operation when the signal M1TEST="1" is as follows.

In this case, "0" is inputted to the terminal TEST of the mega-macro 41 so that all the test mode terminals of the mega-macro 41 are placed in a high impedance when they are viewed from the outside of the mega-macro 41. Further, "1" is inputted to the respective terminals TEST of the mega-macro 31 and the interface block units 52 and 53, so that with respect to the mega-macro 31 and the interface block units 52 and 53, all their test mode terminals are valid. Therefore, the test mode terminals of the mega-macro 31 can be observed at the pins A, C and D in such a way that the terminal $T_{in}$ is observed at the pin A, the terminal $T_{out1}$ is observed at the pin C, and the terminals $T_{io1}$ and $T_{out2}$ are observed at the pin D. Thus, the macro-isolation test can be made for the mega-macro 31.

Likewise, when the signal M2TEST="1", all the test mode terminals of the mega-macro 41 can be observed through the pins A, C and D, so that the macro-isolation test can also be made for the mega-macro 41.

Now referring to FIGS. 6A, 6B, 7 and 8, the second embodiment of the present invention will be explained.

Figure 6A:
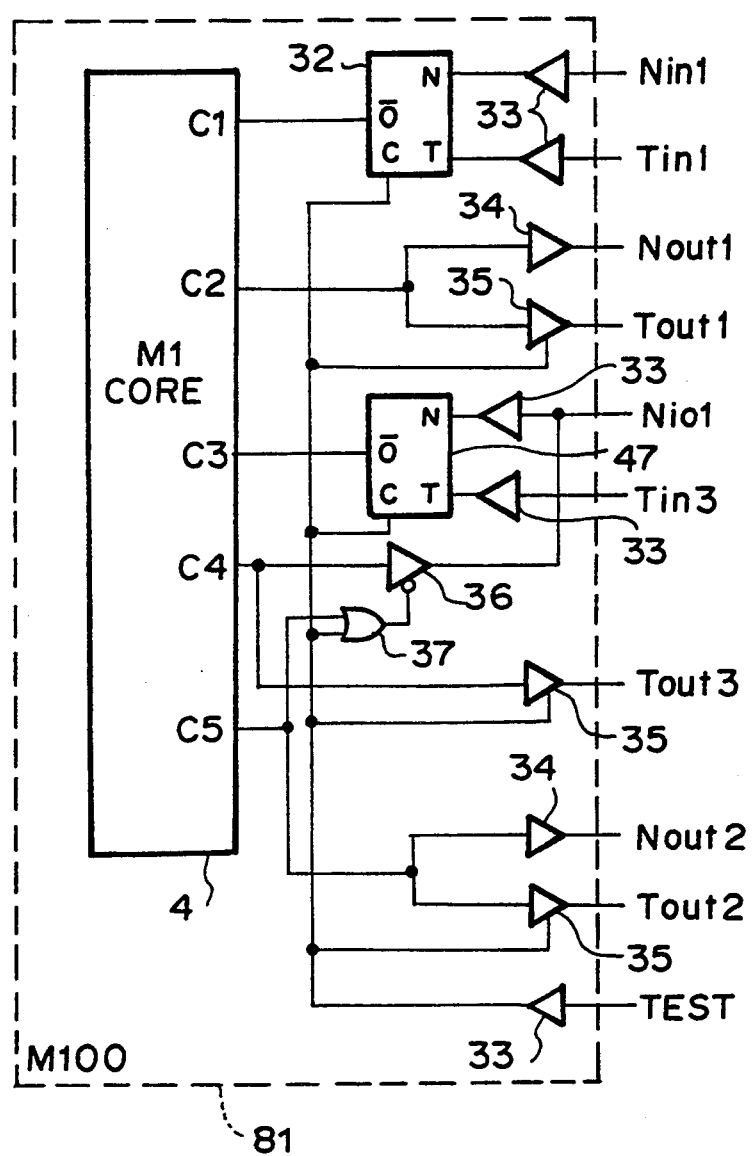
FIGS. 6A and 6B are block diagrams of the megamacros according to the second embodiment of the present invention.
Figure 6B:
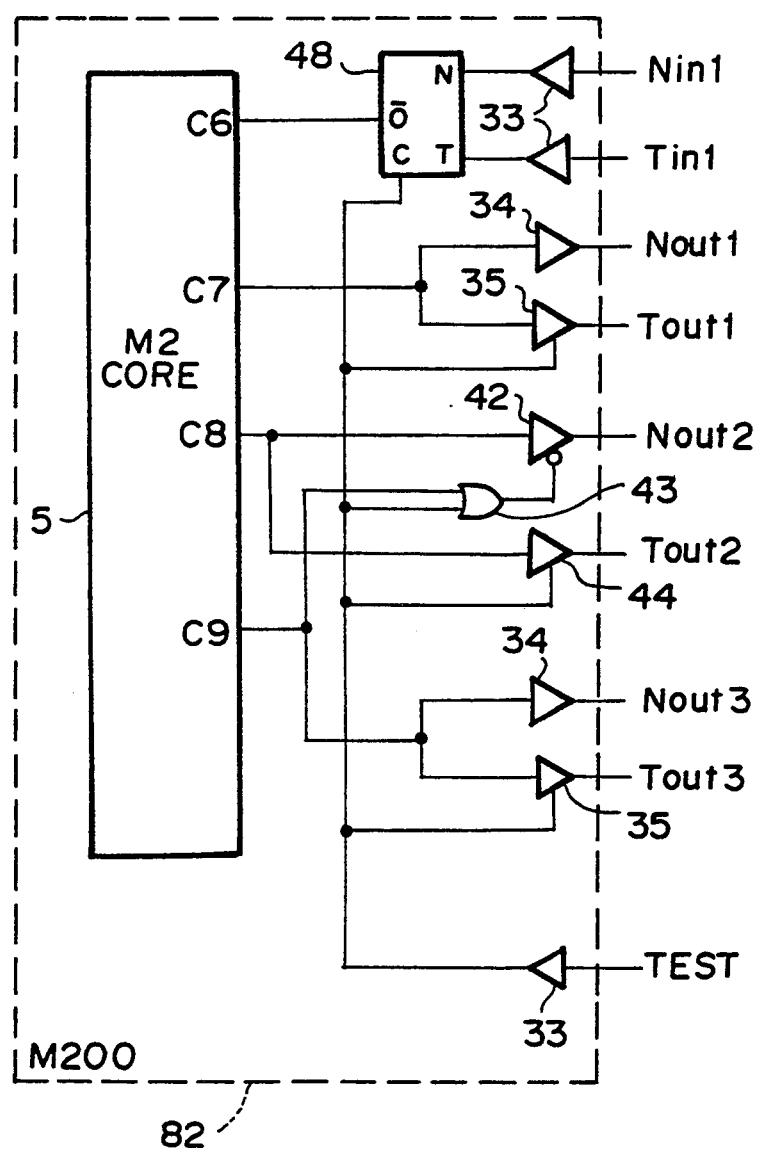
Figure 7:
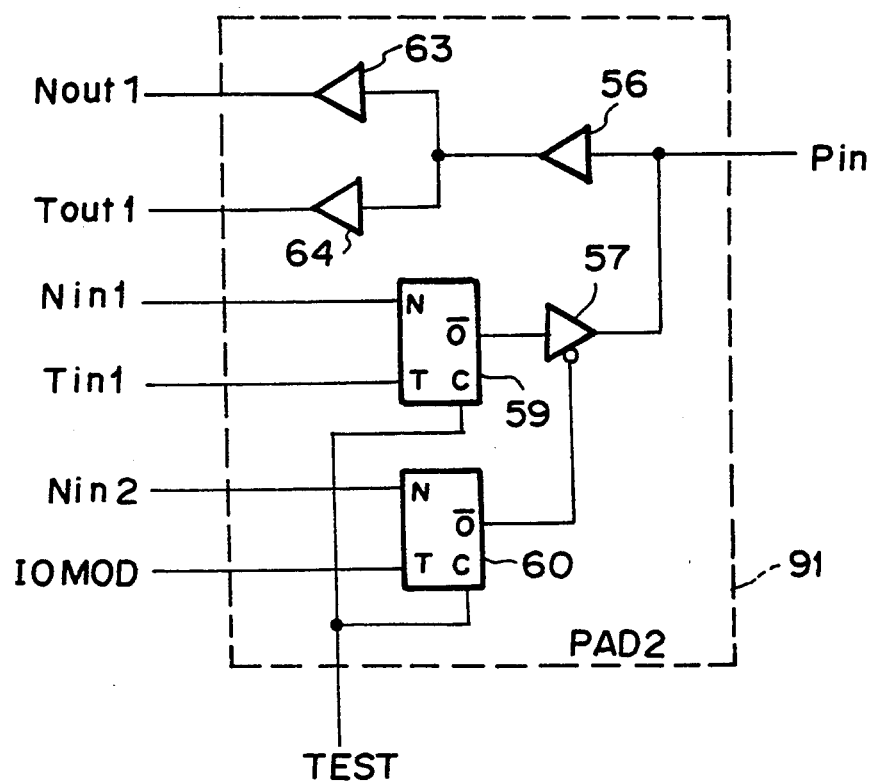
FIG. 7 is a block diagram of the interface block according to the second embodiment of the present invention.

FIGS. 6A and 6B show mega-macros 81 and 82 according to the second embodiment of the present invention. FIG. 7 shows an interface block unit 91 according to the same embodiment of the present invention.

The mega-macros 81 and 82 shown in FIGS. 6A and 6B, respectively, correspond to the mega-macros where the present invention is applied to the mega-macros 2 and 3 in FIG. 1.

In the mega-macro 81, its terminals $N_{in1}$, $N_{out1}$, $N_{io1}$ and $N_{out2}$ are normal mode terminals, and its terminals $T_{in1}$, $T_{out1}$, $T_{in3}$, $T_{out2}$ and $T_{out3}$ are test mode terminals. The terminals for transferring signals from/to the macro core 4 which is a main body of the mega-macro 81 serve as the normal mode terminals when the signal TEST="0" and as the test mode terminals when the signal TEST="1".

The mega-macro 81 according to this second embodiment is different from the mega-macro 31 according to the first embodiment in that the test mode terminal corresponding to the normal mode input/output terminal $N_{io1}$ is composed of two separate terminals of the input terminal $T_{in3}$ and the output terminal $T_{out3}$.

On the other hand, in the mega-macro 82, its terminals $N_{in1}$, $N_{out1}$, $N_{out2}$ and $N_{out3}$ are normal mode terminals and its terminals $T_{in1}$, $T_{out1}$, $T_{out2}$ and $T_{out3}$ are test mode terminals. The mega-macro 82 according to this second embodiment is different from the mega-macro 41 according to the first embodiment in that the test mode terminal $T_{out2}$ corresponding to the normal mode terminal $N_{out2}$ providing three state outputs from the mega-macro 82 produces "1" or "0" but is not placed in a high impedance state.

In the interface block unit 91 shown in FIG. 7 according to the second embodiment of the present invention, its terminal $N_{out1}$, $N_{in1}$ and $N_{in2}$ are normal mode terminals, and its terminals $T_{out1}$ and $T_{in1}$ are test mode terminals. The interface block unit 91 according to this second embodiment is different from the interface block unit 53 according to the first embodiment in that the test mode terminal is composed of two terminals of the input terminal $T_{in1}$ and the output terminal $T_{out1}$ separated from each other, and a terminal IOMOD serves to switch input/output of the interface block unit 91 in the test mode wherein the signal TEST="1".

Figure 8:
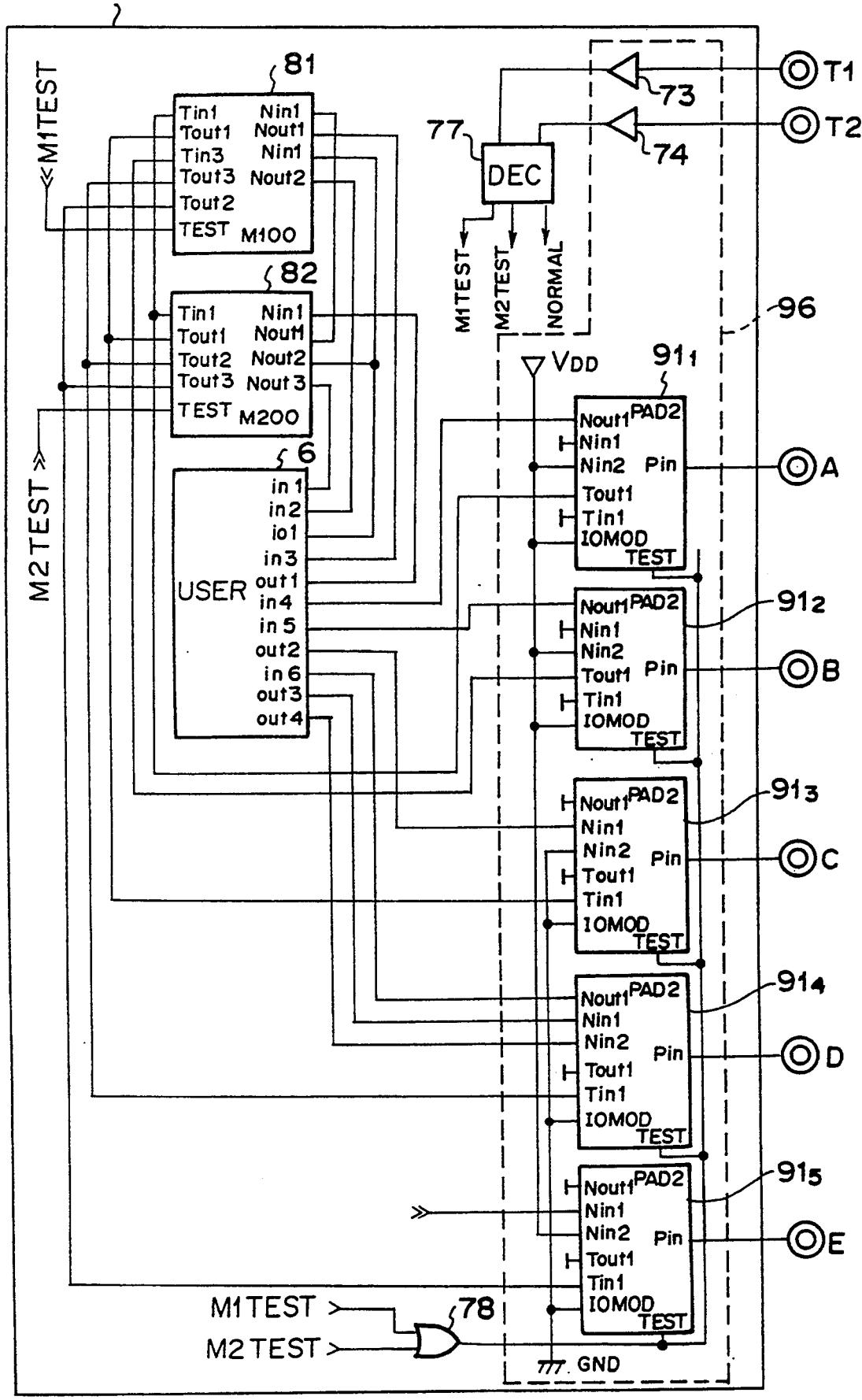
FIG. 8 is a block diagram of the integrated circuit device including a test circuit which adopts the megamacros and the interface blocks shown in FIGS. 6A, 6B and FIG. 7, respectively.

FIG. 8 shows an arrangement of the integrated circuit device 92 constituted by the mega-macros 81, 82 shown in FIGS. 6A, 6B and the interface block unit 91 shown in FIG. 7. Reference numerals $91_1$, $91_2$, $91_3$, $91_4$ and $91_5$ denote interface block units equivalent to the interface block unit 91. The normal mode wirings in the integrated circuit device 92, i.e., the wirings between the normal mode terminals of the mega-macros 81, 82 and those of the interface block units $91_1$ to $91_5$ through the user macro 6 are made in the same way as the wirings among the macros in the integrated circuit device 1 shown in FIG. 3. On the other hand, the test mode wirings are made by directly connecting the test mode terminals of the mega-macros 81, 82 with those of the interface block units $91_1$ to $91_5$. Now, since the level "1" has been applied to the terminals IOMOD of the interface block units $91_1$, $91_2$, and the level "0" has been applied to the terminals IOMOD of the interface block units $91_3$ to $91_5$, in the test mode, each of the interface block units $91_1$ and $91_2$ serves as an input interface block and each of the interface block units $91_3$ to $91_5$ serves as an output interface block. Further, as already described above, all the test mode terminals of the mega-macros 81 and 82 serve as either one of input and output terminals, so that the test mode terminal for input to the mega-macro is connected with the test mode terminal $T_{out}$ of the interface block dedicated to input in the test mode state, and the test mode terminal for output to the mega-macro is connected with the test mode terminal $T_{in}$ dedicated to output in the test mode.

As understood from the explanation hitherto made, in designing the integrated circuit device according to the present invention, the mega-macros and interface blocks are provided with two sets of individual terminals of test mode terminals valid in the test mode and normal mode terminals valid in the normal mode, so that designing for the normal mode can be implemented by normal mode wiring of wiring the normal mode terminals of the mega-macros and the interface blocks, and designing for mega-macro isolation test can be implemented by test mode wiring of individually wiring the respective test mode terminals of the mega-macros and the interface blocks.

Thus, designing for the mega-macro isolation test is work of forming simple decoders and wiring the terminals. This work is very easy so that it can be easily automated without experiencing any human error.

The normal mode wirings and the test mode wirings can be individually made so that with respect to the characteristic, a designer can design the circuit device in a normal mode with no consciousness of the presence of the test circuit.

As the circuit diagram can be shown with the test mode wiring portion being omitted, it can be illustrated as a very simplified circuit with the test circuit being concealed. Therefore, the circuit diagram can be easily analyzed and debugged.

Consequently, the burden given for a designer for test designing is reduced so that the time required for developing an integrated circuit device can be shortened.

In accordance with the present invention, the integrated circuit device is provided in which at least one of a mega-macro(s) and an interface block section has means for switching a mode between a test mode and a normal mode and two sets of individual dedicated terminals which are valid in the test mode and the normal mode, respectively, and serve to transfer signals to/from an internal circuit. Therefore, designing a mega-macro isolation test can be simplified and also a designer can design the circuit in a normal mode with no consciousness of the presence of a test circuit thereby making it easy to analyze and debug the circuit so that the burden of test designing for a designer can be removed thereby to shorten the time needed for developing the integrated circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An integrated circuit device having at least one previously designed macro cell (31, 41; 81, 82) having a library of a standard large scale function block, and an interface block (76, 96) composed of a plurality of cells (51, 52, 53; $91_1$ ... $91_5$) each designed as a library of a standard function block for transferring signals between external terminals and an internal region of an integrated circuit, said macro cell comprising:

switching means (32, 47, 48) for switching a mode between a normal mode and a test mode in response to an input signal applied thereto;

a first group of terminals ($N_{in}$, $N_{io}$, $N_{out}$) associated with said macro cell, said first group of terminals being made to be valid in said normal mode, said first group of terminals transferring signals to and from internal circuits in said macro cell during said normal mode while selected by said switching means;

a second group of terminals ($T_{in}$, $T_{io}$, $T_{out}$) associated with said macro cell, said switching means having access to select said second group of terminals to replace said first group of terminals, said second group of terminals being made valid in said test mode for transferring signals to and from said internal circuit during said test mode when said second group of terminals are selected by said switching means; and means for placing said second group of terminals in a high impedance state while said first group of terminals are valid during said normal mode.

2. An integrated circuit device having at least one previously designed macro cell (31, 41; 81, 82) having a library of a standard large scale function block, and an interface block (76; 96) comprised of a plurality of cells (51, 52, 53; $91_1$ ... $91_5$), each of said plurality of cells being designed as a library of a standard function block for transferring signals between external terminals and an internal region of said integrated circuit, said interface block comprising:

switching means (58, 59, 60; 59, 60) for switching a mode between a normal mode and a test mode in response to an input signal applied thereto;

a first group of terminals ($N_{in}$, $N_{out}$) which are made to be valid while switched into said normal mode, said first group of terminals transferring signals to and from internal circuits in said macro cell during said normal mode while selected by said switching means; and a second group of terminals ($T_{in}$, $T_{out}$) which may be selected, in place of said first group of terminals, said switching means making said second group of terminals valid while said integrated circuit is in said test mode, for transferring signals to and from the internal circuit in said macro cell during said test mode selected by said switching means.

3. An integrated circuit device having at least one predesigned macro cell (31, 41; 81, 82) having a library of a standard large scale function block (76, 96), and an interface block (76; 96) comprising a plurality of cells (51, 52, 53; $91_1$ ... $91_5$) each designed as a library of a standard function block for transferring signals between external terminals (A, B, C, D, E) and an internal region of said integrated circuit, said macro cell comprising:

macro cell switching means (32, 47, 48) for switching a mode between a normal mode and a test mode in response to an input signal applied thereto;

a first group of terminals ($N_{in}$, $N_{io}$, $N_{out}$) which are made to be valid when said switching means switches into said normal mode, for transferring signals to and from an internal circuit of a micro cell during said normal mode selected by said macro cell switching means;

a second group of terminals ($T_{in}$, $T_{io}$, $T_{out}$) which are made valid in place of said first group of terminals when said switching means switches into said test mode, for transferring signals to and from the internal circuit of said micro cell during said test mode selected by said macro cell switching means; and means for placing said second group of terminals in a high impedance state during said normal mode, said interface block comprising:

interface block switching means for switching a mode between said normal mode and said test mode in response to the input signal applied thereto;

a third group of terminals ($N_{in}$, $N_{out}$) which are made valid in said normal mode, for transferring signals to and from an interface block internal circuit during said normal mode selected by said interface block switching means; and a fourth group of terminals ($T_{in}$, $T_{out}$) which are made valid in place of said third group of terminals when said interface block switching means switches into said test mode, for transferring signals to and from the internal circuits of said macro cell during said test mode selected by said interface block switching means, and said integrated circuit comprising means for permitting said macro cell to be directly tested through said external terminals of the integrated circuit by directly connecting said second group of terminals of said macro cell to said fourth group of terminals of said interface block.

4. An integrated circuit device according to claim 3, further comprising at least one user macro (6) composed of standard basic cells, said user macro having input and output terminals (in, io, out) connected with said first group of terminals of said macro cell and said third group of terminals of said interface block.

5. An integrated circuit device according to claim 3, wherein said second group of terminals of said macro cell includes terminals ($T_{in3}$, $T_{out3}$) individually dedicated to input and output.

6. An integrated circuit device according to claim 3, wherein each of cells of said interface block includes the second group of terminals ($T_{in1}$, $T_{out1}$) individually dedicated to input and output.

* * * * *